United States Patent
Boerstler et al.

(10) Patent No.: US 7,863,958 B2
(45) Date of Patent: Jan. 4, 2011

(54) HIGH SPEED CLOCK SIGNAL DUTY CYCLE ADJUSTMENT

(75) Inventors: David William Boerstler, Round Rock, TX (US); Steven Mark Clements, Raleigh, NC (US); Jieming Qi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 33 days.

(21) Appl. No.: 12/347,469

(22) Filed: Dec. 31, 2008

(65) Prior Publication Data

US 2010/0164580 A1 Jul. 1, 2010

(51) Int. Cl.
*H03K 3/017* (2006.01)
(52) U.S. Cl. ..................................... 327/175
(58) Field of Classification Search .................. 327/175
See application file for complete search history.

(56) References Cited

U.S. PATENT DOCUMENTS

| | | | |
|---|---|---|---|
| 6,411,145 B1 | 6/2002 | Kueng | |
| 7,015,739 B2* | 3/2006 | Lee et al. | 327/175 |
| 7,180,346 B2* | 2/2007 | Lee | 327/175 |
| 7,199,634 B2* | 4/2007 | Cho et al. | 327/175 |
| 7,202,722 B2* | 4/2007 | Mahadevan et al. | 327/175 |
| 7,250,801 B2* | 7/2007 | Minzoni | 327/175 |
| 7,501,870 B2* | 3/2009 | Choi et al. | 327/175 |
| 2006/0114042 A1* | 6/2006 | Lee et al. | 327/175 |
| 2006/0284659 A1 | 12/2006 | Tambouris | |
| 2007/0252629 A1 | 11/2007 | Boerstler | |
| 2007/0255517 A1 | 11/2007 | Boerstler | |
| 2007/0266285 A1 | 11/2007 | Boerstler | |
| 2009/0121763 A1* | 5/2009 | Bossu et al. | 327/175 |

OTHER PUBLICATIONS

Heydari—"Design and Analysis of Low-Voltage Current-Mode Logic Buffers"; Proceedings of the 4th International Symposium on Quality Electronic Design, IEEE Computer Society, 2003.
Jovanovic—"Pulsewidth Control Loop as a Duty Cycle Corrector"; Serbian Journal of Electrical Engineering, vol. 1, No. 2, Jun. 2004.
International Search Report in PCT/EP2009/065464.

* cited by examiner

*Primary Examiner*—Lincoln Donovan
*Assistant Examiner*—William Hernandez
(74) *Attorney, Agent, or Firm*—Matt Talpis; Mark P. Kahler

(57) ABSTRACT

A clock signal duty cycle adjustment circuit includes a duty cycle correction circuit that receives a clock input signal that may need duty cycle correction. The duty cycle correction circuit may derive first and second differential clock signals from the clock input signal. The first and second differential clock signals may exhibit respective voltage offsets. The duty cycle correction circuit includes a voltage offset shift circuit that may shift the voltage offset that one of the first and second differential clock signals exhibits to adjust the effective duty cycle of a clock output signal. The duty cycle adjustment circuit derives the clock output signal from the voltage offset adjusted first and second differential clock signals in response to a duty cycle error signal.

18 Claims, 6 Drawing Sheets

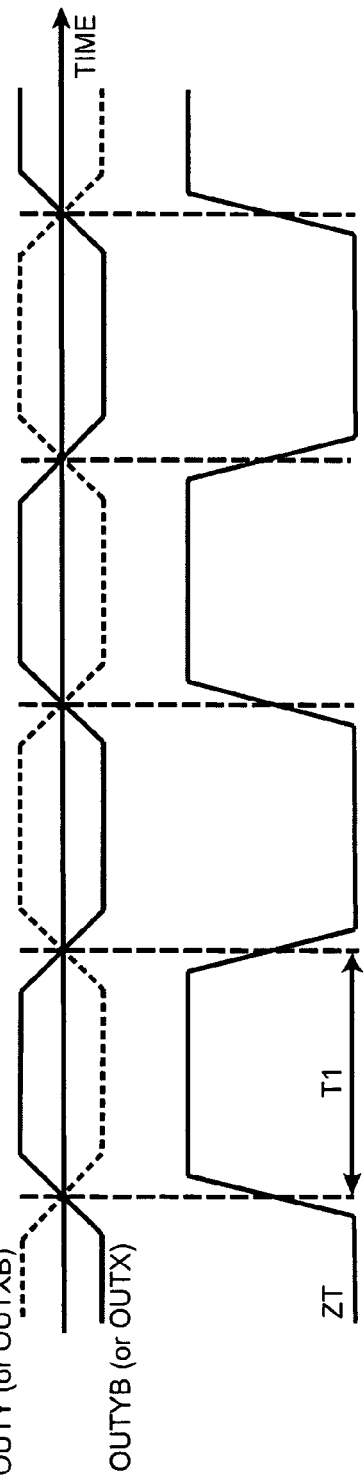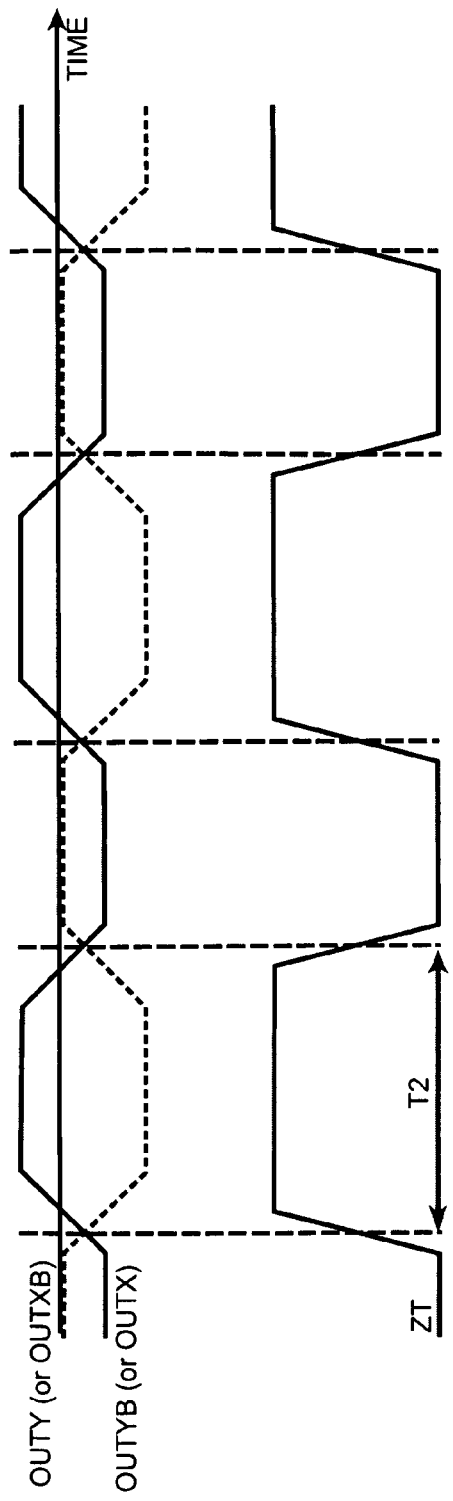
FIG. 3A — CLOCK OUTPUT (ZT) DUTY CYCLE = 50% (NO VOLTAGE OFFSET)
FIG. 3B — CLOCK OUTPUT (ZT) DUTY CYCLE > 50% (OFFSET - OUTY NODE PULLED DOWN)

HIGH SPEED CLOCK SIGNAL DUTY CYCLE ADJUSTMENT

BACKGROUND

The disclosures herein relate generally to information handling systems (IHSs), and more specifically, to the duty cycle of clock signals that such IHSs may employ.

Information handling systems (IHSs) employ clock signals to control the timing of some of the components of such systems. Modern IHSs may require clock circuits that operate at very high speeds. The duty cycle of a clock signal refers to the amount of time a clock signal exhibits a first logic state, for example a logic high, versus the amount of time the clock signal exhibits a second logic state, for example a logic low. A clock signal exhibits a 50% duty cycle if the amount of time that the clock signal exhibits a first logic state is the same as the amount of time that the clock signal exhibits the second logic state. Duty cycle distortion is the variance that a particular clock signal exhibits from a desired duty cycle. Duty cycle distortion of clock signal may cause performance degradation in high speed IHSs.

BRIEF SUMMARY

In one embodiment, a method of adjusting the duty cycle of a clock signal is disclosed. The method includes generating, by a clock signal source circuit, a clock input signal that includes true and complement clock signals. The method also includes receiving, by a duty cycle correction circuit, the clock input signal. The method further includes deriving from the clock input signal, by the duty cycle correction circuit, first and second differential clock signals corresponding to the true and complement clock signals, respectively, the first and second differential clock signals exhibiting respective voltage offsets. The method still further includes shifting, by the duty cycle correction circuit, the voltage offset of one of the first and second differential clock signals in response to a duty cycle exhibited by a clock output signal derived from the first and second differential clock signals.

In another embodiment, a duty cycle adjustment circuit is disclosed. The duty cycle adjustment circuit includes a clock input that receives a clock input signal that includes true and complement clock signals. The duty cycle adjustment circuit also includes a duty cycle correction circuit, coupled to the clock input, that derives from the clock input signal first and second differential clock signals corresponding to the true and complement clock signals, respectively, the first and second differential clock signals exhibiting respective voltage offsets. The duty cycle correction circuit includes a voltage offset shift circuit that shifts the voltage offset exhibited by one of the first and second differential clock signals in response to a duty cycle exhibited by a clock output signal derived from the first and second differential clock signals, the duty cycle correction circuit thus providing a duty cycle adjusted clock output signal.

BRIEF DESCRIPTION OF THE DRAWINGS

The appended drawings illustrate only exemplary embodiments of the invention and therefore do not limit its scope because the inventive concepts lend themselves to other equally effective embodiments.

FIG. 3A-3C are timing diagrams of differential clock signals at nodes within the disclosed duty cycle adjustment circuit.

DETAILED DESCRIPTION

Figure 1:
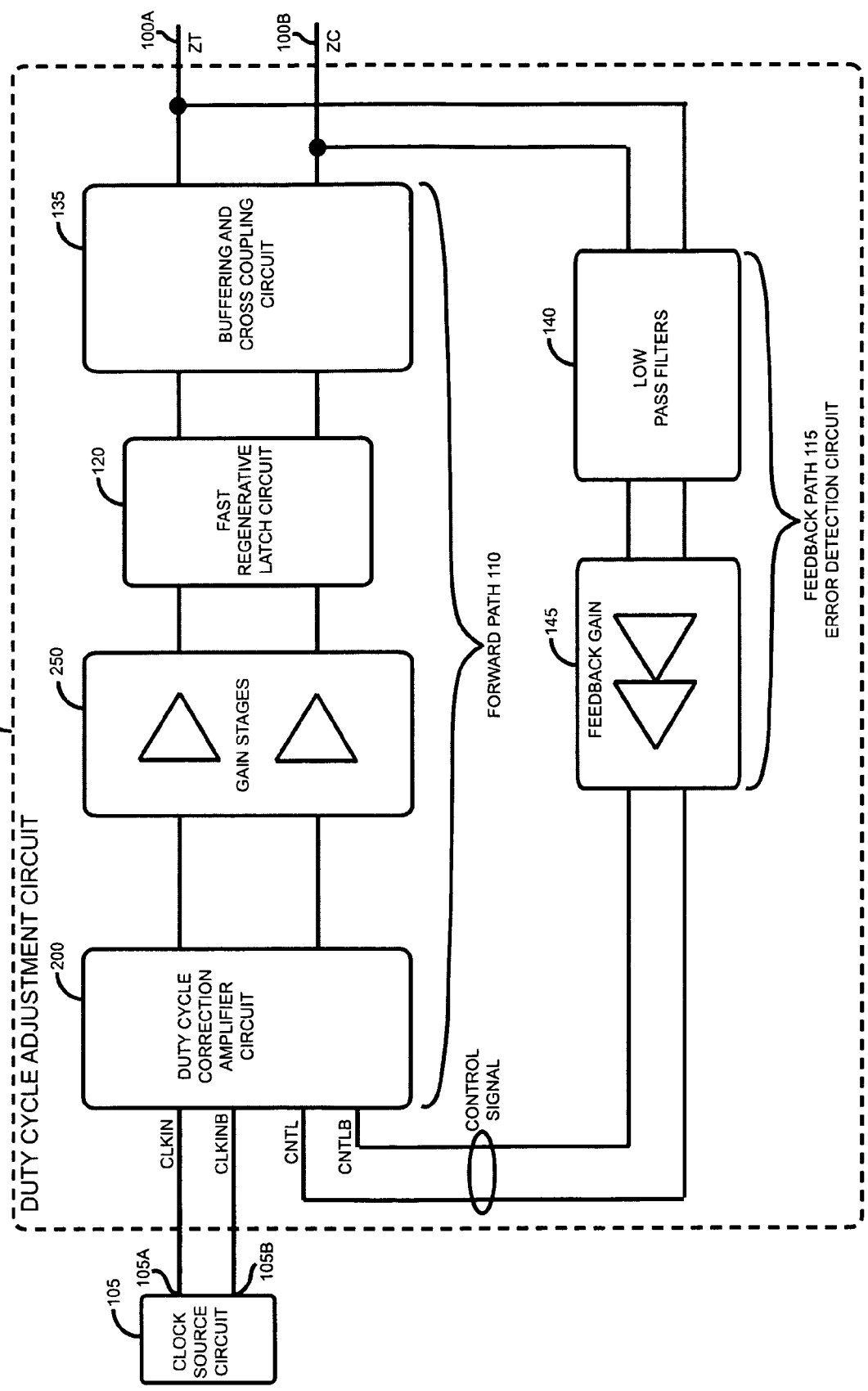
FIG. 1 shows a block diagram of one embodiment of the disclosed duty cycle adjustment circuit.

FIG. 1 shows a block diagram of a duty cycle adjustment circuit 100. A duty cycle adjustment circuit may be desirable to generate a clock signal exhibiting a particular duty cycle. For example, in some applications a 50% clock duty cycle may be desirable, whereas in other applications a duty cycle greater or less than 50% may be desirable. In one embodiment, a clock signal source supplies true and complement clock signals to a duty cycle correction circuit. The duty cycle correction circuit derives first and second differential clock signals that correspond respectively to the true and complement clock signals. These first and second differential clock signals exhibit respective voltage offsets. By changing or shifting the voltage offset of the first differential clock signal with respect to the voltage offset of the second differential clock signal, or vice versa, the duty cycle adjustment circuit 100 may produce true and complement output signals that desirably exhibit a duty cycle of 50%, less than 50% or more than 50%, depending on the amount of voltage offset selected, as described in more detail below.

In FIG. 1, a clock source 105 includes true and complementary outputs, 105A and 105B, that respectively drive CLKIN and CLKINB inputs, respectively, of a duty cycle correction amplifier circuit 200. In this document, the same nomenclature may apply to a signal line as well as the signal itself. For example, the CLKIN clock signal travels to duty cycle correction amplifier circuit 200 on a CLKIN signal line, and the complementary CLKINB signal travels to duty cycle correction amplifier circuit 200 on a CLKINB signal line. In one embodiment, CLKIN and CLKINB are current mode logic (CML) clock signals. ZT and ZC correspond to respective outputs 100A and 10B of duty cycle adjustment circuit 100. ZT and ZC represent complementary duty cycle adjusted clock output signals. Duty cycle adjustment circuit 100 includes a forward path 110 that adjusts the duty cycle of clock signals passing therethrough in response to a feedback signal or error signal in a feedback path 115.

Forward path 110 includes duty cycle correction amplifier circuit 200, gain stages 250, fast regenerative latch circuit 120, and a buffering and cross coupling circuit 135 that provides duty cycle adjusted clock output signals ZT and ZC at clock outputs 100A and 100B, respectively. Feedback path 115 includes low pass filters 140 and a feedback gain stage 145 that provides differential control signals, namely a true control signal CNTL and a complement control signal CNTLB to respective control inputs of duty cycle correction amplifier circuit 200. The low pass filters 140 and feedback gain stage 145 together form an error detection circuit in feedback path 115.

Figure 2:
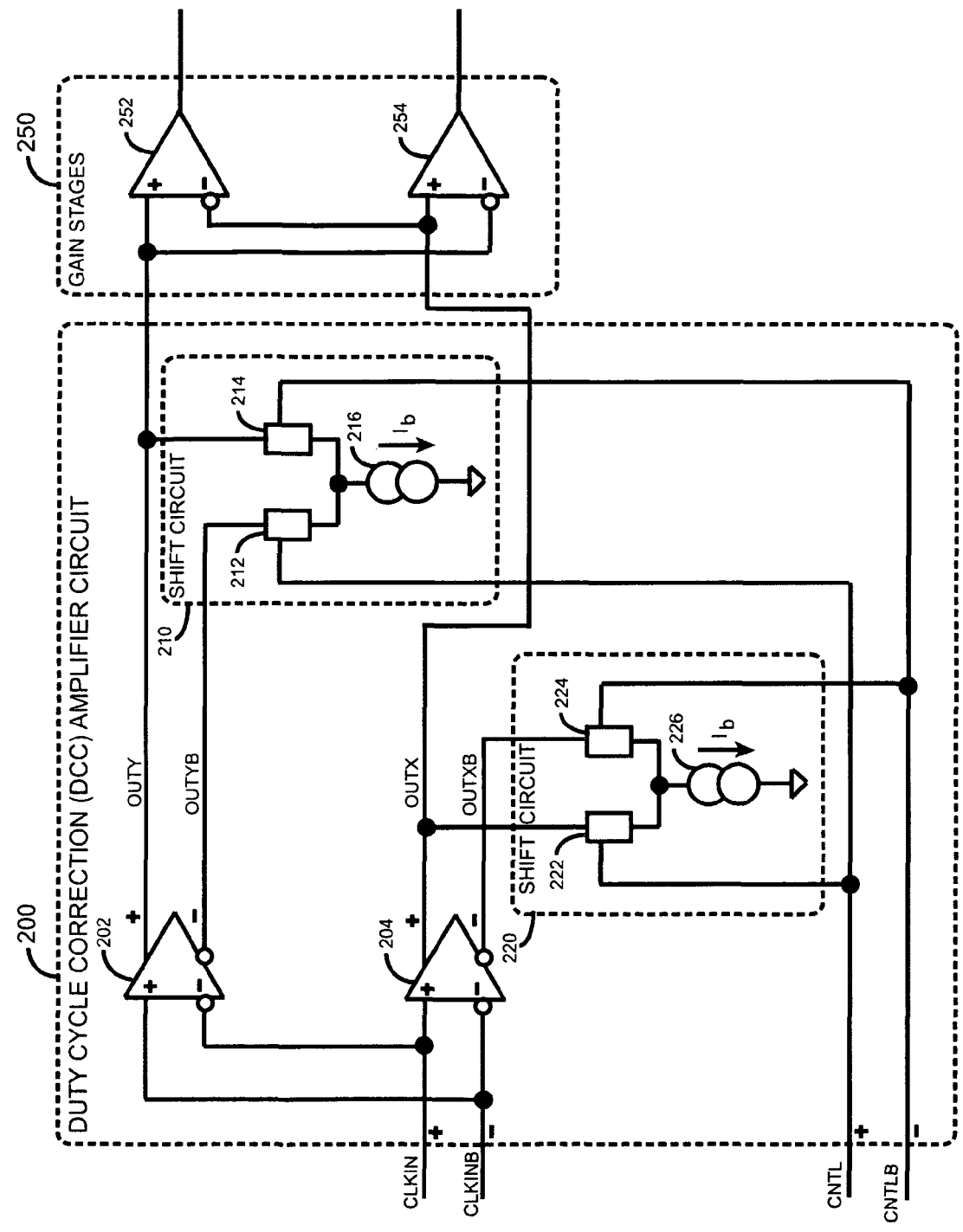
FIG. 2 shows a schematic diagram of a duty cycle correction amplifier circuit and gain stages of the disclosed duty cycle adjustment circuit.

FIG. 2 is a schematic diagram of duty cycle correction (DCC) amplifier circuit 200 and gain stages 250. DCC circuit 200 includes differential amplifiers 202 and 204. An inverting input of differential amplifier 202 and a non-inverting input of differential amplifier 204 couple to the CLKIN input of DCC circuit 200. A non-inverting input of differential amplifier 202 and an inverting input of differential amplifier 204 couples to the CLKINB input of DCC circuit 200. Differential amplifiers 202 and 204 are thus cross-coupled. Differential amplifier 202 generates true and complementary output signals OUTY and OUTYB. A voltage level shift circuit 210, or voltage offset shift circuit, couples to the outputs of differential amplifier 202 to shift the voltage level or voltage offset of the OUTY output signal with respect to the OUTYB signal or vice versa. This voltage level shifting changes the duty cycle of the ZT output clock signal as described in more detail below. The amount of voltage shifting that shift circuit 210 imparts varies with the true and complement control signals CNTL and CNTLB that feedback path 115 provides. Voltage level shift circuit 210 includes source-coupled FETs 212 and 214 and current source 216 that connect as shown. In response to control signals CNTL and CNTLB, shift circuit 210 may pull down either the OUTY signal with respect to the OUTYB signal via pull-down FET 214, or pull down the OUTYB signal with respect to the OUTY signal via pull-down FET 216.

Differential amplifier 204 generates true and complementary output signals OUTX and OUTXB. A voltage level shift circuit 220 couples to the outputs of differential amplifier 204 to shift the voltage level or voltage offset of the OUTX output signal with respect to the OUTXB signal or vice versa. This voltage level shifting changes the duty cycle of the ZC output clock signal as described in more detail below. The amount of voltage shifting that shift circuit 220 imparts varies with the true and complement control signals CNTL and CNTLB that feedback path 115 provides. Voltage level shift circuit 220 includes source-coupled FETs 222 and 224 and current source 226 connected as shown. In response to control signals CNTL and CNTLB, shift circuit 220 may pull down either the OUTX signal with respect to the OUTXB signal via pull-down FET 222, or pull down the OUTXB signal with respect to the OUTX signal via pull-down FET 224. This action alters the duty cycle of the resultant ZT-ZC output signal as described in more detail below with reference to FIGS. 3A-3C.

Gain stages 250 couple to outputs of differential amplifiers 202 and 204 as shown. Gains stages 250 include a differential amplifier 252, the non-inverting input of which couples to differential amplifier 202 to receive the OUTY signal therefrom. The inverting input of differential amplifier 252 couples to differential amplifier 204 to receive the OUTX signal therefrom. Gain stages 250 also include a differential amplifier 254, the non-inverting input of which couples to differential amplifier 204 to receive the OUTX signal therefrom. The inverting input of differential amplifier 254 couples to differential amplifier 202 to receive OUTY signal therefrom. Differential amplifiers 252 and 254 of gain stages 250 thus exhibit a cross-coupling arrangement. In this cross-coupling arrangement, the non-inverting input of differential amplifier 252 couples to the inverting input of differential amplifier 254, and the inverting input of differential amplifier 252 couples to the non-inverting input of differential amplifier 254.

Each stage or block of duty cycle adjustment circuit 100 of FIG. 1 couples to a voltage source (not shown), or voltage rail, that provides power thereto. Referring again to FIG. 1, gain stages 250 couple to fast regenerative latch circuit 120. While the adjusted clock signals that gain stages 250 provide to latch circuit 120 may not be fully rail-to-rail, latch circuit 120 converts or changes the signals passing therethrough to rail-to-rail voltage. In other words, while duty cycle correction amplifier circuit 200 and gain stages 250 may be current mode logic (CML) stages that are not rail-to-rail, latch circuit 120 transforms signals passing therethrough to rail-to-rail. Buffering and cross coupling circuit 135 couples to latch circuit 120 to buffer and cross couple signals passing therethrough. Buffering and cross coupling circuit 135 provides duty cycle adjusted clock signals ZT and ZC signals at outputs 100A and 100B, respectively. The duty cycle adjusted clock signal ZC is the complement of duty cycle adjusted clock signal ZT.

Low pass filters 140 in feedback path 115 process the true and complementary duty cycle adjusted clock signals ZT and ZC to form respective DC voltage signals that are proportional to the duty cycles that the ZT and ZC signals exhibit. In this manner, after amplification by feedback gain stage 145, feedback path 115 provides control signals CNTL and CNTLB that exhibit DC voltages proportional to the adjusted duty cycles of clock output signals ZT and ZC, respectively.

Figure 3C:
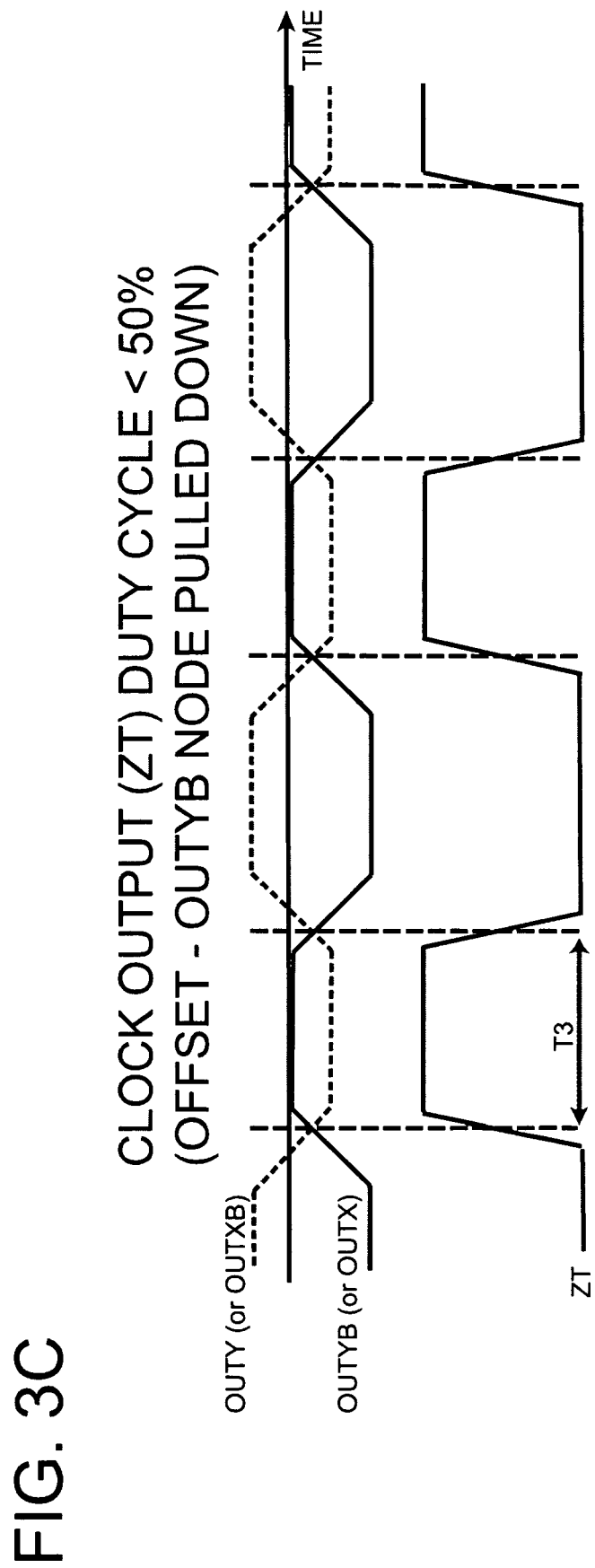

FIG. 3A-3C are timing diagrams that demonstrate the adjustment of the duty cycle of the ZT clock output signal by duty cycle correction (DCC) amplifier circuit 200. FIG. 3A shows a clock output signal (ZT) that exhibits a 50% duty cycle in response to CNTL and CNTLB feedback control signals that adjust the voltage level or voltage offset of the OUTY and OUTB node signals as shown therein. In FIG. 3A, the CNTL and CNTLB control signals set the voltage level or voltage offset of the OUTY and OUTB node signals such that there is no offset, or the offset is zero. In other words, with respect to the time axis or x-axis of FIG. 3A, the OUTY and OUTB signals center around that time axis, as shown. Whenever the OUTY or OUTYB signal transitions across the time axis, the ZT clock output signal transitions from low to high or high to low in response as shown in FIG. 3A. The ZT clock output signal thus exhibits a 50% duty cycle in the case where the voltage offset of the OUTY and OUTYB signals is zero. In the 50% duty cycle scenario, shifting circuits 210 and 220 changes neither the voltage offset of OUTY nor OUTYB.

However, DCC circuit 200 may adjust the duty cycle of the ZT clock output signal to be more than 50% by adjusting the voltage level or voltage offset of the OUTY signal with respect to the OUTYB signal as shown in FIG. 3B. More particularly, to achieve a greater than 50% duty cycle, the CNTL and CNTLB control signals may instruct voltage level shift circuit 210 to pull the voltage of the OUTY signal node down with respect to the voltage of the OUTYB signal node. In FIG. 2, OUTY identifies both the OUTY signal and the OUTY node at which that signal exists. Similarly, OUTYB identifies both the OUTYB signal and the OUTYB node at which that signal exists. When shift circuit 210 pulls down the OUTY node with respect to the OUTYB node, the time between the transitions across the time axis increases as seen by comparing time T1 of FIG. 3A with time T2 of FIG. 3B. In the above greater than 50% duty cycle scenario, signal OUTY is the voltage offset shifted differential clock signal and signal OUTYB is a voltage offset un-shifted differential clock voltage offset. Shift circuit 220 operates in a fashion similar to shift circuit 210 to form the complement of the ZT clock output signal, namely the ZC clock output signal. Shift circuit 220 operates in response to the CNTL and CNTLB in a manner complementary to the operation of shift circuit 210.

If desired, DCC circuit 200 may alternatively adjust the duty cycle of the ZT output clock signal to be less than 50%, in response to the CNTL and CNTLB control signals, by pulling the voltage of the OUTYB signal node down with respect to voltage level of the OUTY signal node as seen in FIG. 3C. In the above less than 50% duty cycle scenario, signal OUTY is the voltage offset un-shifted differential clock signal and signal OUTYB is a voltage offset shifted differential clock voltage offset. In FIG. 3C, time T3 is less than time T1 of the unadjusted duty cycle or no voltage offset case. In FIGS. 3A-3C, times T1, T2 and T3 respectively determine the duty cycle of the clock output signals ZT and ZC.

Figure 4:
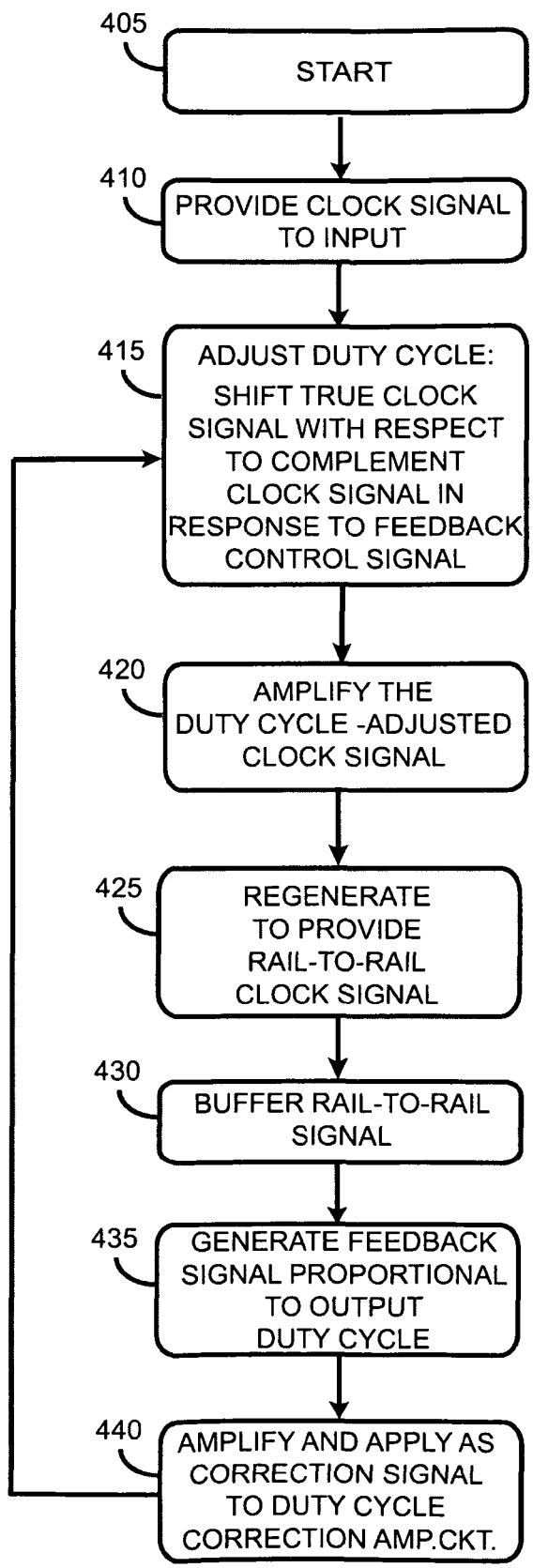
FIG. 4 is a flowchart that depicts representative process flow in a duty cycle adjustment circuit that carries out the disclosed methodology.

FIG. 4 is a flowchart that shows representative process flow in duty cycle adjustment circuit 100. Process flow commences at start block 405. Clock source circuit 105 provides true and complementary clock input signals CLKIN and CLKINB to duty cycle correction (DCC) amplifier circuit 200, as per block 410. DCC circuit 200 adjusts the duty cycle of the true and complementary clock signals passing therethrough in response to feedback control signals, CNTL and CNTLB, as per block 415. More particularly, DCC circuit 200 shifts the voltage level or offset of one of a true clock signal and a complementary clock signal in response to the feedback control signals. Gain stages 250 amplify the resultant duty cycle-adjusted clock signal, as per block 420. Regenerative latch circuit 120 latches and regenerates a rail-to-rail version of the duty cycle-adjusted clock signal, as per block 425. Latch circuit 120 also buffers the resultant rail-to-rail version of the duty cycle adjusted clock signal to provide a clock output signal, as per block 430. Low pass filters 140 generate feedback control signals CNTL and CNTLB that exhibit DC output levels that are proportional to the duty cycle of the clock output signals, ZT and ZC, respectively, as per block 435. Feedback gain stage 145 amplifies the feedback control signals CNTL and CNTLB that duty cycle adjustment circuit 100 applies as duty cycle correction signals to DCC circuit 200, as per block 440. In response, DCC circuit 200 adjusts internal node voltages thereof by an amount that the CNTL and CNTLB signals indicate thus determining the duty cycle that the clock outputs signals ZT and ZC exhibit.

Figure 5:
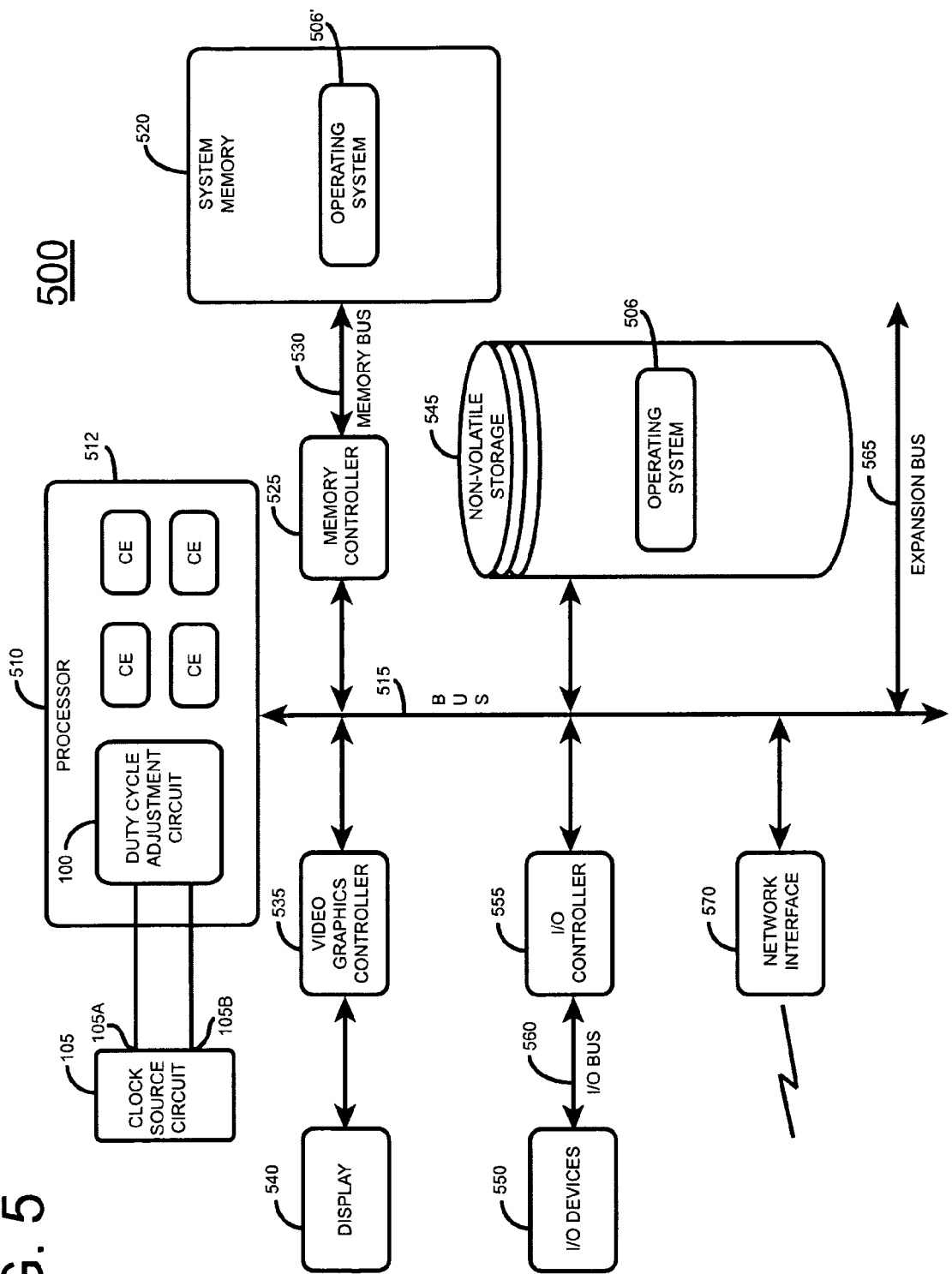
FIG. 5 depicts an information handling system that employs the duty cycle adjustment circuit of FIG. 1.

FIG. 5 shows an information handling system (IHS) 500 that includes a processor 510 with duty cycle adjustment circuit 100 therein. Clock source circuit 105 couples via inputs 105A and 105B to duty cycle adjustment circuit 100. Processor 510 includes multiple compute elements (CEs) or processor cores on a common semiconductor die 512. IHS 100 processes, transfers, communicates, modifies, stores or otherwise handles information in digital form, analog form or other form. IHS 100 includes a bus 515 that couples processor 510 to system memory 520 via a memory controller 525 and memory bus 530. A video graphics controller 535 couples display 540 to bus 515. Nonvolatile storage 545, such as a hard disk drive, CD drive, DVD drive, or other nonvolatile storage couples to bus 515 to provide IHS 500 with permanent storage of information. Nonvolatile storage 545 stores an operating system 506. Operating system 506 loads in memory 520 as operating system 506' to govern the operation of IHS 500. I/O devices 550, such as a keyboard and a mouse pointing device, couple to bus 515 via I/O controller 555 and I/O bus 560. One or more expansion busses 565, such as USB, IEEE 1394 bus, ATA, SATA, PCI, PCIE and other busses, couple to bus 515 to facilitate the connection of peripherals and devices to IHS 500. A network interface adapter 570 couples to bus 515 to enable IHS 500 to connect by wire or wirelessly to a network and other information handling systems. While FIG. 5 shows one IHS that employs processor 510, the IHS may take many forms. For example, IHS 500 may take the form of a desktop, server, portable, laptop, notebook, or other form factor computer or data processing system. IHS 500 may take other form factors such as a gaming device, a personal digital assistant (PDA), a portable telephone device, a communication device or other devices that include a processor and memory.

The terminology used herein is for the purpose of describing particular embodiments only and is not intended to be limiting of the invention. As used herein, the singular forms "a", "an" and "the"are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of adjusting the duty cycle of a signal, the method comprising:
   generating, by a clock signal source circuit, a clock input signal that includes true and complement clock signals;
   receiving, by a duty cycle correction circuit, the clock input signal;
   deriving from the clock input signal, by the duty cycle correction circuit, first and second differential clock signals corresponding to the true and complement clock signals, respectively, the first and second differential clock signals exhibiting respective voltage offsets; and
   shifting, by the duty cycle correction circuit, the voltage offset of one of the first and second differential clock signals in response to a duty cycle exhibited by a clock output signal derived from the first and second differential clock signals, wherein the duty cycle correction circuit shifts the voltage offset of one of the first and second differential clock signals in response to a duty cycle error signal to provide a voltage offset shifted differential clock signal and a voltage offset un-shifted differential clock signal.

2. The method of claim 1, further comprising detecting, by an error detection circuit, a duty cycle error in the clock output signal.

3. The method of claim 2, wherein the detecting step includes low pass filtering, by a low pass filter in the error detection circuit, the clock output signal to generate the duty cycle error signal.

4. The method of claim 3, further comprising generating, by the low pass filter, a DC voltage error signal that exhibits a voltage proportional to the duty cycle of the clock output signal.

5. The method of claim 2, wherein the detecting step includes determining, by the error detection circuit, times when the voltage offset shifted differential clock signal intersects with the voltage offset un-shifted differential clock signal.

6. The method of claim 1, further comprising providing the first and second differential clock signals to first and second nodes, respectively, of the duty cycle correction circuit, the duty cycle correction circuit pulling one of the first and second nodes down to shift the voltage offset of one of the first and second differential clock signals to affect the duty cycle of the clock output signal.

7. A duty cycle adjustment circuit, comprising:
a clock input that receives a clock input signal that includes true and complement clock signals;
a duty cycle correction circuit, coupled to the clock input, that derives from the clock input signal first and second differential clock signals corresponding to the true and complement clock signals, respectively, the first and second differential clock signals exhibiting respective voltage offsets;
the duty cycle correction circuit including a voltage offset shift circuit that shifts the voltage offset exhibited by one of the first and second differential clock signals in response to a duty cycle exhibited by a clock output signal derived from the first and second differential clock signals, the duty cycle correction circuit thus providing a duty cycle adjusted clock output signal, wherein the duty cycle correction circuit shifts the voltage offset of one of the first and second differential clock signals in response to a duty cycle error signal, thus providing a voltage offset shifted differential clock signal and a voltage offset un-shifted differential clock signal.

8. The duty cycle adjustment circuit of claim 7, further comprising an error detection circuit, coupled to the duty cycle correction circuit to receive the clock output signal and detect duty cycle error in the clock output signal.

9. The duty cycle adjustment circuit of claim 8, wherein the error detection circuit includes a low pass filter that filters the clock output signal to generate the duty cycle error signal.

10. The duty cycle adjustment circuit of claim 9, wherein the low pass filter generates a DC voltage error signal that exhibits a voltage proportional to the duty cycle of the clock output signal.

11. The duty cycle adjustment circuit of claim 8, wherein the error detection circuit determines times when the voltage offset shifted differential clock signal intersects with the voltage offset un-shifted differential clock signal.

12. The duty cycle adjustment circuit of claim 7, wherein the duty cycle correction circuit includes first and second nodes to which the first and second differential clock signals are provided, respectively, the duty cycle correction circuit pulling one of the first and second nodes down to shift the voltage offset of one of the first and second differential clock signals to affect the duty cycle of the clock output signal.

13. An information handling system (IHS), comprising
a memory,
a processor coupled to the memory, the processor including a duty cycle adjustment circuit, the duty cycle adjustment circuit including:
a clock input that receives a clock input signal that includes true and complement clock signals;
a duty cycle correction circuit, coupled to the clock input, that derives from the clock input signal first and second differential clock signals corresponding to the true and complement clock signals, respectively, the first and second differential clock signals exhibiting respective voltage offsets;
the duty cycle correction circuit including a voltage offset shift circuit that shifts the voltage offset exhibited by one of the first and second differential clock signals in response to a duty cycle exhibited by a clock output signal derived from the first and second differential clock signals, the duty cycle correction circuit thus providing a duty cycle adjusted clock output signal, wherein the duty cycle correction circuit shifts the voltage offset of one of the first and second differential clock signals in response to a duty cycle error signal, thus providing a voltage offset shifted differential clock signal and a voltage offset un-shifted differential clock signal.

14. The IHS of claim 13, further comprising an error detection circuit, coupled to the duty cycle correction circuit to receive the clock output signal and detect duty cycle error in the clock output signal.

15. The IHS of claim 14, wherein the error detection circuit includes a low pass filter that filters the clock output signal to generate the duty cycle error signal.

16. The IHS of claim 15, wherein the low pass filter generates a DC voltage error signal that exhibits a voltage proportional to the duty cycle of the clock output signal.

17. The IHS of claim 14, wherein the error detection circuit determines times when the voltage offset shifted differential clock signal intersects with the voltage offset un-shifted differential clock signal.

18. The IHS of claim 13, wherein the duty cycle correction circuit includes first and second nodes to which the first and second differential clock signals are provided, respectively, the duty cycle correction circuit pulling one of the first and second nodes down to shift the voltage offset of one of the first and second differential clock signals to affect the duty cycle of the clock output signal.

* * * * *